United States Patent
Tsuboka (10) Patent No.: US 11,368,102 B2
(45) Date of Patent: Jun. 21, 2022

(54) POWER CONVERSION DEVICE (71) Applicant: Mitsubishi Electric Corporation, Tokyo (JP)

(72) Inventor: Masahiko Tsuboka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/051,015

(22) PCT Filed: May 21, 2018

(86) PCT No.: PCT/JP2018/019439
§ 371 (c)(1),
(2) Date: Oct. 27, 2020

(87) PCT Pub. No.: WO2019/224863
PCT Pub. Date: Nov. 28, 2019

(65) Prior Publication Data
US 2021/0135592 A1 May 6, 2021

(51) Int. Cl.
*H02M 7/217* (2006.01)
*H02M 7/5387* (2007.01)
(Continued)

(52) U.S. Cl.
CPC .......... *H02M 7/217* (2013.01); *H02M 1/143* (2013.01); *H02M 3/155* (2013.01); *H02M 7/2176* (2013.01); *H02M 7/53871* (2013.01)

(58) Field of Classification Search
CPC ........................ H02M 7/2176; H02M 7/53871
(Continued)

(56) References Cited

U.S. PATENT DOCUMENTS 6,795,322 B2 * 9/2004 Aihara .................... H02J 9/061
363/37
7,298,120 B2 * 11/2007 Lam ..................... H02M 7/5383
323/272
(Continued)

FOREIGN PATENT DOCUMENTS

EP 3091651 A1 * 11/2016 ......... H01L 29/1608
JP 63-23567 A 1/1988
(Continued)

OTHER PUBLICATIONS

International Search Report for PCT/JP2018/019439 dated Jul. 24, 2018 [PCT/ISA/210].
(Continued)

*Primary Examiner* — Gary A Nash
(74) *Attorney, Agent, or Firm* — Sughrue Mion, PLLC; Richard C. Turner (57) ABSTRACT

In response to a problem wherein a voltage of a capacitor of a power conversion device decreases when a voltage of an alternating current power supply is restored after once decreasing, the voltage of the capacitor drops below a maximum value of the voltage of the alternating current power supply when power is restored, and an inrush current occurs, the power conversion device, provided between an alternating current power supply and a load, is such that a decrease in an input voltage or an input current of a power converting unit is detected, a change in the voltage of the capacitor is predicted, and operations of the power converting unit are caused to stop before the voltage of the capacitor drops to or below the maximum value of the voltage of the alternating current power supply, thereby restricting an occurrence of an inrush current.

19 Claims, 6 Drawing Sheets (51) Int. Cl.
*H02M 1/14* (2006.01)
*H02M 3/155* (2006.01)

(58) Field of Classification Search
USPC .............................. 363/34–35, 37, 65, 67–68
See application file for complete search history.

(56) References Cited

U.S. PATENT DOCUMENTS

| | | | | |
|---|---|---|---|---|
| 2004/0223347 | A1* | 11/2004 | Kobayashi | H02J 9/062 363/37 |
| 2005/0169018 | A1* | 8/2005 | Hatai | H02M 7/53871 363/37 |
| 2011/0227522 | A1* | 9/2011 | Shinomoto | H02M 1/4225 318/400.29 |
| 2013/0334895 | A1* | 12/2013 | Yamamoto | H02J 50/40 307/104 |
| 2015/0236603 | A1* | 8/2015 | Jimichi | H02M 1/14 363/37 |
| 2015/0280593 | A1* | 10/2015 | Ando | B60L 3/04 363/17 |

FOREIGN PATENT DOCUMENTS

| | | | |
|---|---|---|---|
| JP | 2007-041271 A | | 2/2007 |
| JP | 2013059257 A | * | 3/2013 |
| JP | 5460838 B2 | | 4/2014 |
| JP | 2015-192527 A | | 11/2015 |

OTHER PUBLICATIONS

Written Opinion for PCT/JP2018/019439 dated Jul. 24, 2018 [PCT/ISA/237].
Extended European Search Report dated Apr. 16, 2021 from the European Patent Office in EP Application No. 18919543.1.
Communication dated Sep. 21, 2021, issued by the Japanese Patent Office in application No. 2020-520863.

* cited by examiner

POWER CONVERSION DEVICE

CROSS REFERENCE TO RELATED APPLICATIONS

This application is a National Stage of International Application No. PCT/JP2018/019439 filed May 21, 2018.

TECHNICAL FIELD

The present application relates to a power conversion device that converts alternating current voltage into direct current voltage, and in particular, relates to a power conversion device having a capacitor that smooths an output.

BACKGROUND ART

A power conversion device that converts power supplied from an alternating current power supply into direct current while improving a power factor thereof, and supplies the direct current power to a load, continues an operation in a state wherein absolutely no power is input into the power conversion device, or a state wherein the input power is small, when a failure, a momentary interruption, or a momentary failure of the alternating current power supply occurs. Because of this, a charge of a capacitor provided at an output end inside the power conversion device is continuously extracted, and a capacitor voltage decreases. Subsequently, when the power of the alternating current power supply is restored, an inrush current occurs when the capacitor voltage is smaller than the alternating current power supply voltage when power is restored, causing a problem in that a semiconductor switching element inside the power conversion device is destroyed.

A factor in the inrush current occurring is that the capacitor voltage is lower than the alternating current power supply voltage, and a magnitude of the inrush current depends on a difference between a magnitude of an input voltage when power is restored after a short power failure, a momentary interruption, or a momentary failure, and the capacitor voltage when power is restored. Because of this, in Patent Literature 1, a capacitor voltage decrease is restricted by causing an operation of the load to stop when the capacitor voltage drops to or below a predetermined reference value, thereby restricting the inrush current when power is restored.

Generally, it is often the case that a difference in potential between the capacitor voltage and the alternating current power supply voltage is small when a power conversion device operates. A reason for this is that the higher the breakdown voltage of a capacitor, the higher the cost and the greater the size, because of which it is necessary to select a capacitor with a low breakdown voltage in order to reduce size and reduce cost, and when attempting to design so that capacitor voltage ripple does not exceed the capacitor breakdown voltage, the capacitor voltage when the power conversion device operates is inevitably a voltage near the alternating current power supply voltage.

As in Patent Literature 1, restricting a difference between a voltage across the capacitor immediately before power is restored after a momentary failure and the alternating current voltage input into the capacitor when power is restored after the momentary failure is appropriate in order to restrict the inrush current when power is restored, and in order to realize this, it is sufficient that the voltage across the capacitor is detected, and that when it is determined that the detected voltage has dropped to or below a reference voltage based on an inrush current resistance of a semiconductor element configuring the capacitor, control is carried out so as to cause the operation of the load connected to the power conversion device to stop.

CITATION LIST

Patent Literature

Patent Literature 1: Japanese Patent No. 5,460,838

SUMMARY OF INVENTION

Technical Problem

However, a speed at which the capacitor voltage decreases depends on a magnitude of an output that extracts the charge from the capacitor and on a capacitor capacitance. Also, there is a tendency for a reduction of excess capacitor capacitance to be carried out in order to aim for a reduction in size and a reduction in cost of a power conversion device, and there is a tendency for the speed of the capacitor voltage decrease when a failure, a momentary interruption, or a momentary failure occurs to be high owing to an increase in output of the power conversion device. Because of this, causing the load to stop after the capacitor voltage dropping to or below the reference voltage value is detected, as in the case of the technology disclosed in Patent Literature 1, means that when the difference in potential between the capacitor voltage and the alternating current power supply voltage at a time of a steady operation is small, the reference value can only be set to a value near a maximum value of the alternating current power supply voltage or a value equal to or smaller than the maximum value of the alternating current power supply voltage, and there is a problem in that the capacitor voltage drops below the maximum value of the input voltage when power is restored during a time delay caused by signal transmission and information processing from the decrease of the capacitor voltage being detected until causing the load to stop, and a large inrush current cannot be prevented from occurring.

When the occurrence of a large inrush current cannot be prevented, a semiconductor element with high current resistance that takes the magnitude of the inrush current into consideration needs to be used, and it is difficult for an element of a wide bandgap semiconductor material such as SiC, GaN, or diamond, which generally have a low withstand current, to be used in a power conversion device, because of which a problem occurs in that realizing a small-sized, low cost power conversion device is hindered.

The present application discloses technology for resolving the aforementioned problems, and has an object of providing a power conversion device with a high degree of freedom, wherein there is no problem even when an element of a wide bandgap semiconductor material is used.

Solution to Problem

A power conversion device disclosed in the present application is a power conversion device provided between an alternating current power supply and a load, and is characterized by including a power converting unit, a capacitor connected to an output end of the power converting unit, a power detecting unit that detects power input into the power converting unit, and a control unit that detects a change in the input power based on a value detected by the power detecting unit, predicts a decrease of voltage of the capacitor caused by the change in the input power, and causes an operation of the power converting unit to stop.

Advantageous Effects of Invention

According to the power conversion device disclosed in the present application, a capacitor voltage decrease is predicted by detecting a change in input power, and an operation of the power conversion device is caused to stop before the capacitor voltage becomes smaller than an input voltage, whereby an inrush current can be prevented, an element of a semiconductor material with low current resistance can be used, and a power conversion device with a high degree of freedom can be obtained. Also, as there is no need to provide a semiconductor element with current resistance, a power conversion device configuration that is smaller and of a lower cost compared with the same semiconductor material can be obtained.

DESCRIPTION OF EMBODIMENTS

First Embodiment

Figure 1:
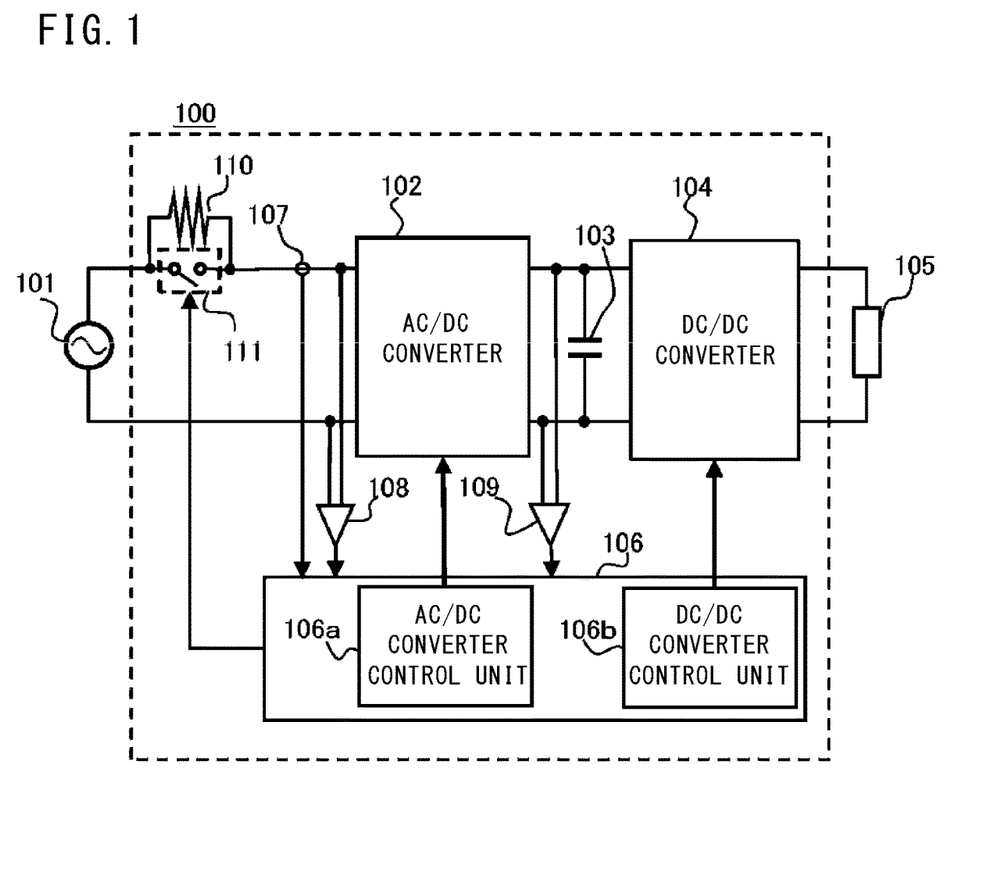
FIG. 1 is a configuration drawing showing a configuration of a power conversion device according to a first embodiment.

FIG. 1 is a configuration drawing showing a schematic configuration of a power conversion device 100 according to a first embodiment. As shown in the drawing, the power conversion device 100 is connected between an alternating current power supply 101, such as a commercial power supply of a power system, and a load 105. Further, the power conversion device 100 includes an AC/DC converter 102 configured of a semiconductor element or the like, a capacitor 103 connected to an output end of the AC/DC converter 102, and a DC/DC converter 104, configured of a semiconductor element or the like, that converts power output by the AC/DC converter 102 into an arbitrary direct current voltage. That is, the load 105 is connected to an output end of the DC/DC converter 104. Furthermore, the power conversion device 100 includes a voltage detecting unit 108 that detects an input voltage of the AC/DC converter 102, a current detecting unit 107 that detects an input current, a control unit 106 including an AC/DC converter control unit 106a that controls the AC/DC converter 102 and a DC/DC converter control unit 106b that controls an operation of the DC/DC converter 104, a capacitor voltage detecting unit 109 that detects a voltage of the capacitor 103, a current limiting resistor 110, and switching means 111.

The AC/DC converter 102 is a step-up type converter, and has a function of converting power supplied from the connected alternating current power supply 101, such as a commercial power supply, into an arbitrary direct current while improving a power factor thereof, and the capacitor 103 connected to the output end of the AC/DC converter 102 has a function of smoothing an output voltage of the AC/DC converter 102. The DC/DC converter 104 has a function of converting the power output by the AC/DC converter 102 into an arbitrary direct current voltage, while isolating the output power, and supplying the converted direct current voltage to the load 105.

When the AC/DC converter 102 and the DC/DC converter 104 are operating, the switching means 111 is in an on-state.

Figure 2:
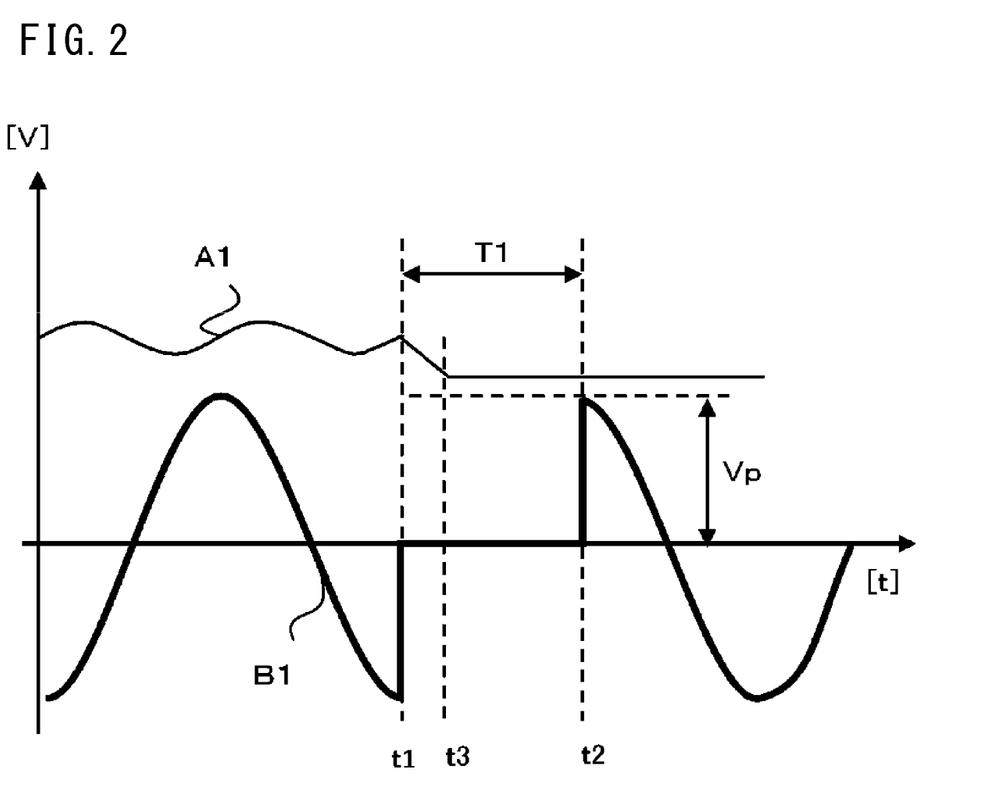
FIG. 2 is a drawing of capacitor voltage and alternating current power supply voltage waveforms of the power conversion device according to the first embodiment.

An example of waveforms of a voltage of the capacitor 103 and a voltage of the alternating current power supply 101 when a momentary interruption or a momentary failure occurs in a case wherein measures of the present application are implemented is shown in FIG. 2.

In FIG. 2, a waveform A1 represents a change in a voltage value of the capacitor 103, and a waveform B1 represents a change in an output voltage of the alternating current power supply 101. That is, focusing on the output voltage of the alternating current power supply 101, a momentary interruption or a momentary failure occurs at a time t1, after which power is restored at a time t2. A period T1 from the time t1 to the time t2 is a momentary interruption or a momentary failure period, and in the case shown in FIG. 2, a momentary interruption or a momentary failure occurs for a half-cycle of the alternating current power supply 101. In the present application, the alternating current power supply 101 is such that when a failure, a momentary interruption, or a momentary failure of the alternating current power supply 101 occurs, the failure, the momentary interruption, or the momentary failure is detected using a value detected by the voltage detecting unit 108 or the current detecting unit 107 before the voltage of the capacitor 103 drops to or below a maximum value Vp of the voltage of the alternating current power supply 101 when power is restored, and an operation of the power conversion device is caused to stop at a time t3, whereby a decrease in the voltage of the capacitor 103 is prevented, and an occurrence of an inrush current and destruction of a part configuring the power conversion device 100 are prevented.

Figure 3:
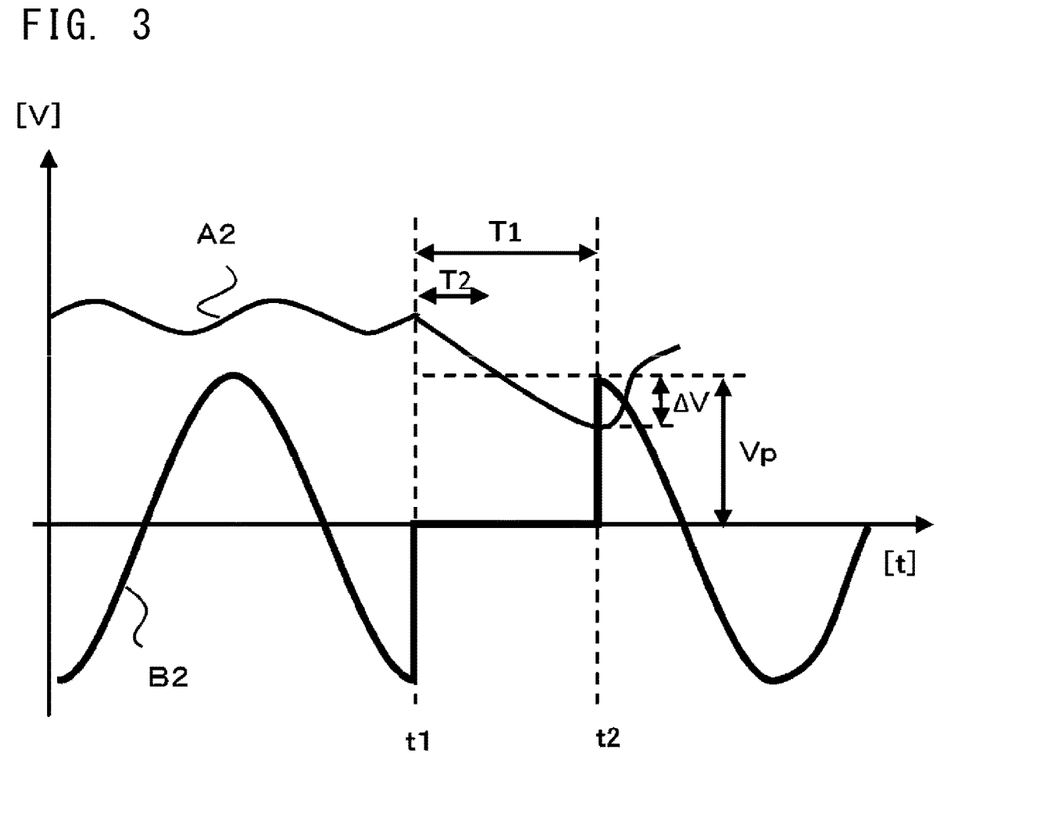
FIG. 3 is a drawing of capacitor voltage and alternating current power supply voltage waveforms of a power conversion device of a comparative example.

An example of waveforms of the voltage of the capacitor 103 and the voltage of the alternating current power supply 101 when a momentary interruption or a momentary failure occurs in a case wherein operations of the AC/DC converter 102 and the DC/DC converter 104 are continued when a momentary interruption or a momentary failure occurs is shown in FIG. 3 as a comparative example with respect to the first embodiment.

In FIG. 3, a waveform A2 represents a change in the voltage value of the capacitor 103, and a waveform B2 represents a change in the output voltage of the alternating current power supply 101. That is, it is understood from the output voltage of the alternating current power supply 101 that a momentary interruption or a momentary failure occurs at the time t1, after which power is restored at the time t2, in the same way as is shown in FIG. 2. The period T1 from the time t1 to the time t2 is a momentary interruption or a momentary failure period, and in FIG. 3, a momentary interruption or a momentary failure occurs for a half-cycle of the alternating current power supply 101. A period T2 represents a time of discharge by the capacitor 103, that is, a capacitor discharge time, and the voltage of the capacitor 103 decreases as shown in FIG. 3 due to a discharge being carried out in excess of the capacitor discharge time T2.

Focusing on the voltage of the capacitor 103 of FIG. 3, the AC/DC converter 102 and the DC/DC converter 104 continue to operate even though a momentary interruption or a momentary failure occurs at the time t1, because of which the DC/DC converter 104 outputs the charge of the capacitor 103 to the load 105 from the time t1 onward in a state wherein there is no input voltage, and the capacitor 103 is not charged by the AC/DC converter 102. Because of this, the voltage of the capacitor 103 decreases in accordance mainly with a magnitude of output power and the capacitor capacitance, and as the decreased voltage of the capacitor 103 has dropped below the maximum voltage Vp of the alternating current power supply 101 when power is restored at the time t2, an inrush current dependent on a magnitude of ΔV flows from the alternating current power supply 101 into the capacitor 103 when power is restored at the time t2. Therefore, a semiconductor element with comparatively weak current resistance configuring the AC/DC converter 102, which is in a current path between the alternating current power supply 101 and the capacitor 103, is destroyed.

IGBTs (insulated gate bipolar transistors), MOSFETs (metal-oxide-semiconductor field effect transistors), or the like are used as switching elements of the AC/DC converter 102 and the DC/DC converter 104. The switching elements may be configured of a semiconductor in which Si (silicon) is used, or can be configured of elements of SiC (silicon carbide), GaN (gallium nitride), $Ga_2O_3$ (gallium oxide), diamond, or a similar kind of wide bandgap semiconductor material.

In the embodiment of the present application, the matter that a power failure, a momentary interruption, or a momentary failure has occurred is detected by the voltage detecting unit 108 or the current detecting unit 107 before the voltage of the capacitor 103 drops to or below the maximum value of the voltage of the alternating current power supply 101 when power is restored, because of which the operations of the AC/DC converter 102 and the DC/DC converter 104 are caused to stop when an absolute value of a value detected by the voltage detecting unit 108 continues to be equal to or smaller than a reference voltage value for an allowable capacitor discharge time T21, and when an absolute value of a value detected by the current detecting unit 107 continues to be equal to or smaller than a reference current value for the allowable capacitor discharge time T21.

As the values detected by the voltage detecting unit 108 and the current detecting unit 107 may be negative values, the absolute values of the detected values are used for determining whether the detected values are equal to or smaller than the reference voltage value and equal to or smaller than the reference current value.

When the difference in potential between the voltage of the capacitor 103 and the voltage of the alternating current power supply 101 is small, the reference value can only be set to a value near the maximum value of the alternating current power supply voltage or a value equal to or smaller than the maximum value of the alternating current power supply voltage, and there is a high possibility that an occurrence of an inrush current cannot be restricted, but in the present application, the input voltage and the input current are detected, because of which operations are stopped at a stage at which, in an extreme case, the voltage of the capacitor 103 has barely decreased at all, whereby a decrease in the voltage of the capacitor 103 is prevented, and the occurrence of an inrush current can be restricted.

A description will be given of methods of setting the reference voltage value, the reference current value, and the allowable capacitor discharge time T21 such that an inrush current into the AC/DC converter 102 is prevented, and the operation of the power conversion device 100 is not erroneously caused to stop when the output voltage of the alternating current power supply 101 is steady.

In the present application, the values detected by the voltage detecting unit 108 and the current detecting unit 107 are such that a momentary voltage value and a momentary current value of a sinusoidal wave output by the alternating current power supply 101 are detected, because of which a detected value drops below the reference voltage value or the reference current value in a vicinity of a zero crossing of the sinusoidal wave, even when the output voltage of the alternating current power supply 101 is steady. This means that when the allowable capacitor discharge time T21 is set short, and the reference voltage value is set too small, the AC/DC converter 102 and the DC/DC converter 104 are caused to stop at a time wherein the output voltage of the alternating current power supply 101 is steady. This means that as alternating current voltage and alternating current are detected in the present application, care is needed when setting the allowable capacitor discharge time T21, the reference voltage value, and the reference current value.

A time wherein the output voltage of the alternating current power supply 101 is steady is assumed to be a state wherein no failure, momentary interruption, or momentary failure of the voltage of the alternating current power supply 101 input into the AC/DC converter 102 is occurring, and moreover, a state wherein the alternating current power supply 101 is outputting a voltage within a range prescribed for the product.

Firstly, a method of setting the allowable capacitor discharge time T21 will be described.

In order to prevent an inrush current, the operations of the AC/DC converter 102 and the DC/DC converter 104 need to be caused to stop before the voltage of the capacitor 103 drops to or below the maximum voltage value Vp of the alternating current power supply 101 when power is restored, as shown by the waveform of FIG. 2.

When the capacitance of the capacitor 103 is C, the output voltage is P, an initial capacitor voltage is V0, and a capacitor voltage after discharge (a maximum value of a power supply voltage when power is restored) is V1, the capacitor discharge time T2 can be derived from Equation (1), because of which the capacitor discharge time T2 is derived using Equation (1), and the allowable capacitor discharge time T21 is set to a value shorter than the capacitor discharge time T2.

$$T=(1/2)C\cdot(V0^2-V1^2)\div P \qquad (1)$$

As one example, the capacitor discharge time T2 is assumed to be 1 ms (millisecond) in this embodiment. A simulation and an actual testing device or the like may be used in the derivation of the allowable capacitor discharge time T21. Because of this, discharge factors other than the output power, such as a phase of an actually occurring capacitor voltage ripple and a discharge resistance, can also be taken into consideration, because of which a discharge time T of the capacitor can be more accurately calculated. Because of this, the power conversion device is not caused to stop excessively early, because of which the power conversion device can be operated to as great an extent as possible, and more power can be converted in a short time.

As the maximum value V1 of the power supply voltage of the alternating current power supply 101 when power is restored cannot be envisaged when a power failure occurs, a case in which the capacitor discharge time T2 is shortest is envisaged, and the maximum value V1 is assumed to have a peak value of 280 Vrms, which is a maximum value prescribed for the product of alternating current voltage input into the AC/DC converter. 280 Vrms is no more than an example. The output power P is a maximum output of the power conversion device 100, the capacitor capacitance C is a minimum capacitance that takes initial capacitance deviation, temperature variation, and temporal deterioration into consideration, and the initial capacitor voltage V0 is the minimum capacitor voltage when the power conversion device is operating, whereby the capacitor discharge time T2 is estimated. Because of this, an inrush current can be prevented in a state wherein the power conversion device 100 is operating, even when an alternating current voltage in the prescribed range is restored after a power failure, a momentary interruption, or a momentary failure.

Also, when calculating the capacitor discharge time by simulation too, the simulation is carried out under strict conditions such that an inrush current is more likely to occur, in the same way as previously described. Because of this, an inrush current can be prevented in states wherein various power conversion devices are operating, even when an alternating current voltage in a prescribed range is restored after a power failure, a momentary interruption, or a momentary failure.

The allowable capacitor discharge time T21 may be of any kind of value, provided that the allowable capacitor discharge time T21 is smaller than the capacitor discharge time T2. The reason for the allowable capacitor discharge time T21 being set to a value smaller than the capacitor discharge time T2 is in order to give consideration to a delay time from a power failure, a momentary interruption, or a momentary failure being detected by the control unit until the operations of the AC/DC converter 102 and the DC/DC converter 104 being caused to stop. Herein, as an example, the allowable capacitor discharge time T21 is set to 500 μs (microseconds), which is one-half of the capacitor discharge time T2 of 1 ms.

As it is generally the case that the greater the output power P, the greater the capacitor capacitance C becomes, the power conversion device 100 is such that C P is practically constant. Also, when V0 is a maximum value of a commercial power supply of a power system and V1 is a minimum value of a general capacitor voltage when the power conversion device 100 is operating, the capacitor discharge time T2 is found from Equation (1) to be approximately 1 ms. This means that when the allowable capacitor discharge time T21 is equal to or less than 500 μs, which is one-half of 1 ms, an inrush current can be prevented in the power conversion device 100 connected to the commercial power supply, and the previously described advantages are obtained.

Next, a method of setting the reference voltage value and the reference current value will be described. Where the detected voltage and current values decrease is in a vicinity of a zero crossing of sinusoidal waves of voltage and current of the alternating current power supply, because of which the values of the reference voltage value, the reference current value, and the allowable capacitor discharge time T21 need to be set to values that are in a vicinity of a zero crossing of the sinusoidal wave, and are not such that the operation of the power conversion device 100 is erroneously caused to stop.

Figure 4:
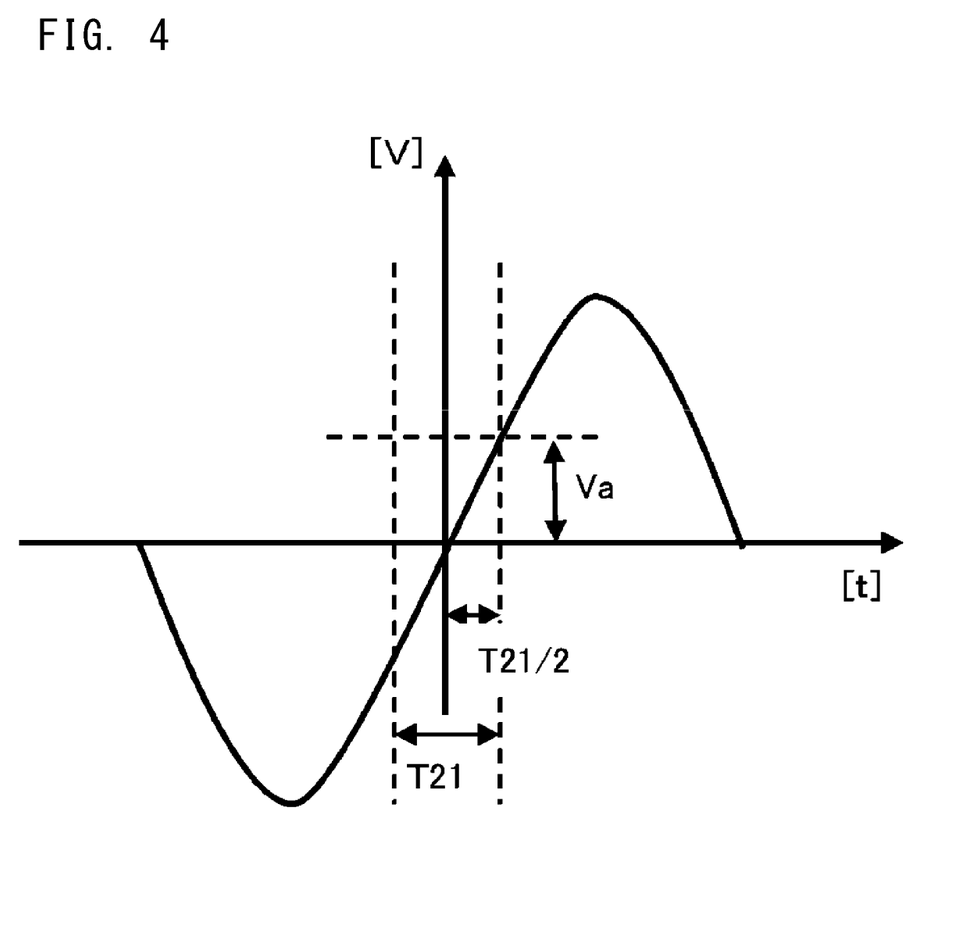
FIG. 4 is an illustration illustrating a setting of a reference voltage value in the power conversion device according to the first embodiment.

FIG. 4 shows a schematic view regarding a method of setting a reference voltage value such that the operation of the power conversion device is not erroneously caused to stop when there is no power failure, momentary interruption, or momentary failure due to a detected value dropping below the reference voltage value or the reference current value in a period in which there is a small voltage in a vicinity of a zero crossing of the sinusoidal wave voltage of the alternating current power supply 101.

When a value in a phase of a time that is one-half of the allowable capacitor discharge time T21 of 500 μs (250 μs) from a point of a zero crossing of the sinusoidal wave voltage of the alternating current power supply 101 is assumed to be an upper limit value Va of the reference voltage in FIG. 4, the reference voltage value may be any value equal to or smaller than the upper limit value Va of the reference voltage. The reference voltage value is set to be equal to or smaller than the upper limit value of the reference voltage because it is necessary to consider a voltage detection error, a delayed detection, and the like. The above description also applies in a case of a reference current value and a reference current upper limit value.

Owing to the reference voltage value being set to be equal to or smaller than the upper limit value Va of the reference voltage, the detected voltage value is not continuously equal to or smaller than the reference voltage value for the allowable capacitor discharge time T21 when the output voltage of the alternating current power supply 101 is steady, because of which the operations of the AC/DC converter 102 and the DC/DC converter 104 can be prevented from being erroneously stopped. By the allowable capacitor discharge time T21, the reference voltage value, and the reference current value being set as heretofore described, the operations of the AC/DC converter 102 and the DC/DC converter 104 can be continued in a case of a change in the alternating current voltage of an extent such that the capacitor voltage does not drop to or below an allowable capacitor discharge voltage.

Also, for example, when the reference voltage value is set to 0 in order to detect a power failure, there is a possibility that due to a sensor reading error, an absence of alternating current voltage cannot be detected even when a power failure is occurring. By the upper limit value of the reference voltage being set as previously described, and the reference voltage value being set to a value that is equal to or smaller than the upper limit value of the reference voltage and higher than 0V, the AC/DC converter 102 and the DC/DC converter 104 can be caused to stop when the voltage of the alternating current power supply 101 decreases, without being caused to stop when the output voltage of the alternating current power supply 101 is steady. This advantage is the same in the case of the reference current value.

When time is (t) and an effective value of the alternating current power supply voltage is Vs, a function V(t) of a time of the output voltage of the alternating current power supply 101 is expressed by Equation (2).

$$V(t)=\sqrt{2}\times Vs\times\sin(2\pi ft) \qquad (2)$$

It is understood from Equation (2) that a voltage value in a phase of a time that is one-half of the allowable capacitor discharge time T21 of 500 μs (250 μs) from a point of a zero crossing of the sinusoidal wave voltage of the alternating current power supply 101 depends on the effective value Vs of the alternating current power supply voltage. When a commercial power supply is envisaged as the alternating current power supply 101, it is supposed that the effective value of the voltage of the alternating current power supply 101 differs depending on the country, and that the effective value fluctuates. Because of this, the reference voltage value is set as a proportion of the effective value of the voltage of the alternating current power supply 101 (the input voltage of the AC/DC converter 102) detected by the voltage detecting unit.

When a power supply frequency is, as an example, 42.5 Hz, and a time t is 250 μs, which is one-half of the allowable capacitor discharge time T21, $\sqrt{2} \times \sin(2\pi ft)$ on the right side of Equation (2) is calculated to be 0.047, because of which the upper limit value of the reference voltage is understood to be a value that is 4.7% of the effective value of the output voltage Vs of the alternating current power supply 101. Therefore, the reference voltage value is assumed here, as an example, to be 3%, which is a value equal to or smaller than 4.7% of the upper limit value of the reference voltage. By 3% of the effective value of the detected voltage of the alternating current power supply 101 being adopted as the reference voltage value, the operations of the AC/DC converter 102 and the DC/DC converter 104 can be prevented from being erroneously stopped, even when the output voltage of the alternating current power supply 101 changes.

The reason for the frequency f being 42.5 Hz is that the lower the frequency, the lower the upper limit value of the reference voltage becomes, and an erroneous stopping of an operation can be prevented, because of which the value takes a commercial frequency of 50 Hz minus 15% into consideration.

In this embodiment, the reference voltage value is set as a proportion of the effective value of the voltage of the alternating current power supply 101, but the reference voltage value may be set as a proportion of a peak value ($\sqrt{2} \times V_s$) of the voltage of the alternating current power supply 101.

Settings of the allowable capacitor discharge time T21, the reference current value, and the reference current upper limit value using a value detected by the current detecting unit 107 are carried out in the same way as in the case of the allowable capacitor discharge time T21, the reference voltage value, and the reference voltage upper limit value.

By the reference voltage value and the reference current value being set to values in accordance with the effective value of voltage and the effective value of current respectively, as previously described, the reference voltage value and the reference current value can be set in accordance with the magnitudes of the alternating current voltage and the alternating current, even when there are various alternating current voltages and alternating currents.

Provisionally, when the reference voltage value is not determined by a computation from the effective value, it is necessary to envisage a case wherein the alternating current voltage value is small, and to set the reference voltage value small, in order not to erroneously cause the AC/DC converter 102 and the DC/DC converter 104 to stop when the output voltage of the alternating current power supply 101 is steady. However, when a power failure, for example, occurs when the alternating current voltage value is high in this case, stopping is delayed, the capacitor voltage decreases to the limit, and there is a danger of an inrush current occurring due to something unexpected happening. Because of this, the AC/DC converter 102 and the DC/DC converter 104 are caused to stop in accordance with the magnitude of the alternating current voltage value when the reference voltage value is determined by a computation from the effective value, which is safe. This advantage is the same in the case of the reference current value.

Also, when the reference voltage value is set to 3% of the effective value, the greater the effective value is, the greater the reference voltage value becomes. This means that when, for example, a value that is 3% of the effective value is equal to or greater than a predetermined voltage value, the reference voltage value is set to the predetermined voltage value, and when the value that is 3% of the effective value is less than the predetermined voltage value, the reference voltage value is a value obtained by a computation using the effective value of the input current of the AC/DC converter 102. Setting of the reference current value using a value detected by the current detecting unit 107 is carried out in the same way as in the case of the reference voltage value.

As it is desirable that the power conversion device 100 converts as great a power as possible in a short time, the power conversion device 100 is, to as great an extent as possible, caused to operate continuously when operation can be carried out. By the reference voltage value being provided with an upper limit as previously described, stopping more than is necessary when the reference voltage value becomes too large, and the alternating current power supply voltage decreases, can be prevented. This advantage is the same in the case of the reference current value.

In this embodiment, the voltage reference value and the current reference value are set using a computation from an effective value, but one or both of the voltage reference value and the current reference value may be set as constant values by considering sensor error, a voltage range of the alternating current power supply 101, and the like. By so doing, an inrush current can be prevented using a simpler system configuration.

A reference current value set using a value detected by the current detecting unit 107 is such that when the output power and the input power of the power conversion device 100 are small, a target value of the input current of the AC/DC converter 102 held by the AC/DC converter control unit 106a in the control unit 106 is small, because of which the input current is small. Because of this, the value detected by the current detecting unit 107 is a small value even when there is no power failure, momentary interruption, or momentary failure, and there is a possibility of the detected value dropping to or below the reference current value during the allowable capacitor discharge time T21.

This means that in order to detect that the input current is small due to a power failure, a momentary interruption, or a momentary failure, a value that is a predetermined value subtracted from the target value of the input current of the AC/DC converter 102 held by the AC/DC converter control unit 106a may be adopted as the reference current value.

The voltage of the alternating current power supply 101 is such that a somewhat large value is prescribed as a minimum voltage value in a voltage range of the alternating current power supply 101 prescribed in accordance with the product, but as it is necessary to continue the operation of the power conversion device 100 even when the current is of a small value, it is necessary to set a reference current value in accordance with the target value of the input current of the AC/DC converter 102.

Also, in this embodiment, the operations of the AC/DC converter 102 and the DC/DC converter 104 are caused to stop when the absolute value of a value detected by the voltage detecting unit 108 continues to be equal to or smaller than the reference voltage value for the allowable capacitor discharge time T21 and the absolute value of a value detected by the current detecting unit 107 continues to be equal to or smaller than the reference current value for the allowable capacitor discharge time T21.

This means that even when the absolute value of a value detected by the current detecting unit 107 continues to be equal to or smaller than the reference current value for the allowable capacitor discharge time T21, operations can be continued provided that the absolute value of a value detected by the voltage detecting unit 108 does not continue to be equal to or smaller than the reference voltage value for the allowable capacitor discharge time T21.

Conversely, even when the voltage of the alternating current power supply 101 decreases, and the absolute value of a value detected by the voltage detecting unit 108 continues to be equal to or smaller than the reference voltage value for the allowable capacitor discharge time T21, the absolute value of a value detected by the current detecting unit 107 does not continue to be equal to or smaller than the reference current value for the allowable capacitor discharge time T21 provided that there is an input current, because of which operations can be continued. Provided that there is an input current or an input voltage, the capacitor 103 can be charged, and the power conversion device 100 can output power without the voltage of the capacitor 103 decreasing, because of which the power conversion device 100 can operate to as great an extent as possible when able to operate.

A configuration may be such that when the absolute value of a value detected by at least one of the voltage detecting unit 108 and the current detecting unit 107 drops to or below the reference voltage value or the reference current value respectively for the allowable capacitor discharge time T21 while the AC/DC converter 102 and the DC/DC converter 104 are operating, the control unit 106 causes the operations of the AC/DC converter 102 and the DC/DC converter 104 to stop. Because of this, the operations are caused to stop when one or both of the input current and the input voltage are absent, because of which the operations can be caused to stop in a safe state wherein the operations can be caused to stop more quickly, the capacitor voltage decreases less, and an inrush current can be further prevented.

Also, when causing the operations of the AC/DC converter 102 and the DC/DC converter 104 to stop when the absolute value of a value detected by the voltage detecting unit 108 continues to be equal to or smaller than the reference voltage value for the allowable capacitor discharge time T21, regardless of a value detected by the current detecting unit 107, the operations can, depending on the situation, be caused to stop more quickly compared with when the absolute value of a value detected by at least one of the voltage detecting unit 108 and the current detecting unit 107 drops to or below the reference voltage value or the reference current value respectively for the allowable capacitor discharge time T21. Because of this, the operations can be caused to stop in a safe state wherein the capacitor voltage decreases less and an inrush current can be further prevented, and as only a value detected by the voltage detecting unit 108 is used in a determination, an inrush current can be prevented using a simpler system.

A description will be given of an operation when the voltage of the alternating current power supply 101 is restored after the power conversion device 100 is caused to stop due to the voltage of the alternating current power supply 101 decreasing.

When the voltage of the alternating current power supply 101 is restored after the power conversion device 100 is caused to stop due to a failure, a momentary interruption, or a momentary failure of the alternating current power supply 101, the power conversion device 100 can operate, because of which the control unit 106 causes the AC/DC converter 102 and the DC/DC converter 104 to restart when it is detected using the voltage detecting unit 108 that there is voltage of the alternating current power supply 101.

As it is desirable that the power conversion device 100 converts as great a power as possible in a short time, a configuration such that the power conversion device 100 operates immediately when able to operate is adopted.

Note that when the control unit 106 causes the AC/DC converter 102 and the DC/DC converter 104 to restart, the control unit 106 causes the restart after initializing a control constant previously used when controlling the AC/DC converter 102 and the DC/DC converter 104.

This is because when using a control constant, such as an integral term, of an interior of the control unit 106 previously used, for example, when stopping or immediately before stopping when causing the AC/DC converter 102 and the DC/DC converter 104 to restart, control becomes unstable depending on responsiveness after restarting, the voltage of the capacitor 103 fluctuates, and in some cases an inrush current may occur due to the capacitor voltage dropping below the alternating current power supply voltage.

Furthermore, when the voltage of the alternating current power supply 101 decreases due to a power failure, a momentary interruption, a momentary failure, or the like, and the operations of the AC/DC converter 102 and the DC/DC converter 104 are caused to stop, an inrush current is prevented when power is restored by the switching means 111, which is in an on-state when the AC/DC converter 102 and the DC/DC converter 104 are operating, being switched immediately to an off-state, and the current limiting resistor 110 being inserted into a current path between the alternating current power supply 101 and the AC/DC converter 102.

This is because there is concern that when, for example, the time between the alternating current power supply 101 failing and power being restored is long, the voltage of the capacitor 103 will decrease due to discharge resistance or the like, even though the AC/DC converter and the DC/DC converter are caused to stop, and a large inrush current will occur when the power of the alternating current power supply 101 is restored in a state wherein the voltage of the capacitor 103 is decreasing.

When restarting, the voltage of the capacitor 103 being equal to or greater than a predetermined voltage is detected using the capacitor voltage detecting unit 109, and the AC/DC converter 102 and the DC/DC converter 104 are caused to restart in a start-up sequence used when operations are started.

This is because when operations are started in a state wherein the capacitor voltage has decreased more than normal, there is a possibility, depending on control responsiveness, of the capacitor voltage dropping below the alternating current power supply voltage, and an inrush current occurring. Also, by using the start-up sequence, the operation of the power conversion device 100 can be simplified.

The reason for using not only a value detected by the voltage detecting unit 108 but also a value detected by the current detecting unit 107 for determining that there is a power failure in the embodiment is in order to cause operations to continue to as great an extent as possible while there is an input current and the AC/DC converter 102 can supply power to the capacitor 103.

Because of this, the operations of the AC/DC converter 102 and the DC/DC converter 104 may be caused to stop when the absolute value of a value detected by the voltage detecting unit 108 continues to be equal to or smaller than the reference voltage value for the allowable capacitor discharge time T21, without using a value detected by the current detecting unit 107.

In the present application, a configuration wherein, for example, SiC, GaN, diamond, or a similar kind of wide bandgap semiconductor is used as a semiconductor element material can be adopted.

As an occurrence of an inrush current is prevented in the present application, there is no need to provide the semiconductor elements configuring the AC/DC converter 102 and the DC/DC converter 104 with a high current resistance, because of which a wide bandgap semiconductor with a small current resistance can be used.

Also, an advantage of using an element of a wide bandgap semiconductor material in the power conversion device 100 is that a switching frequency can be increased in comparison with a switching element other than an element of a wide bandgap semiconductor material, because of which a reduction in size and an increase in efficiency of the power conversion device 100 can be achieved. In order to increase the switching frequency, a control frequency and a clock frequency of control carried out in the control unit 106 are set high. This means that when using a switching element of a wide bandgap semiconductor material, and applying the present application, the control frequency and the clock frequency are set high, because of which an advantage can be obtained in that a configuration wherein the AC/DC converter 102 and the DC/DC converter 104 can be stopped more promptly when stopping conditions are fulfilled, and an inrush current can be more easily prevented, can be adopted.

Figure 5:
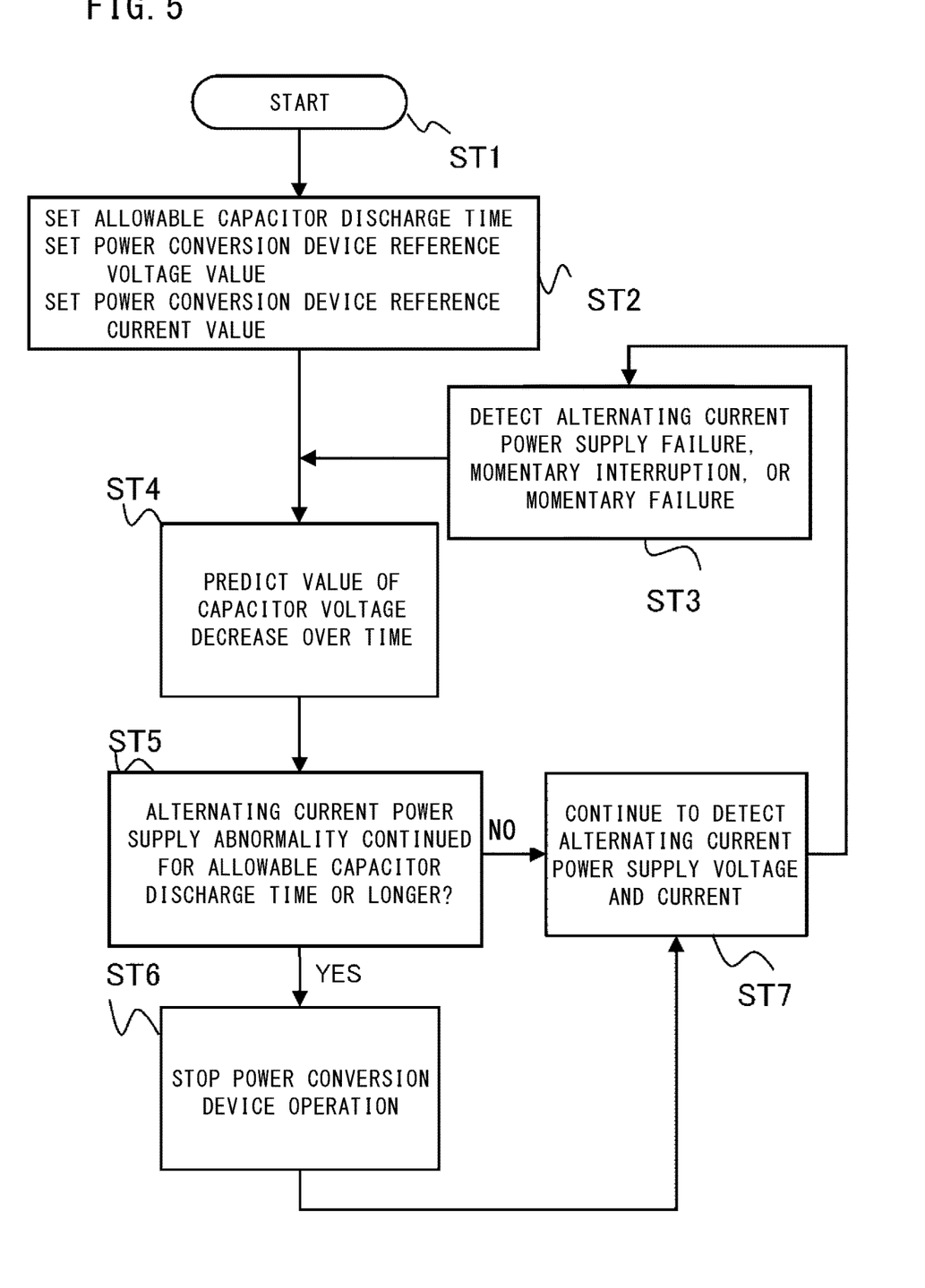
FIG. 5 is a flow diagram showing a control procedure of the power conversion device according to the first embodiment.

A procedure of a control in the power conversion device 100 of this embodiment will be described, based on FIG. 5. On the control starting in step ST1 of FIG. 5, a setting of an allowable capacitor discharge time, a setting of a power conversion device reference voltage value, and a setting of a power conversion device reference current value are carried out as previously described in step ST2. Further, when a failure, a momentary interruption, or a momentary failure of the alternating current power supply is detected from values detected by the current detecting unit and the voltage detecting unit of the power conversion device in step ST3, whereby an alternating current power supply abnormality is detected, a value of a capacitor voltage decrease over time is predicted in step ST4, it is determined in step ST5 whether or not the alternating current power supply abnormality has continued for the allowable capacitor discharge time or longer, the operation of the power conversion device is stopped in step ST6 when it is determined that the abnormality has continued for the allowable capacitor discharge time or longer, and when it is determined that the abnormality has not continued for the allowable capacitor discharge time or longer, detection of the alternating current power supply voltage and current is continued in step ST7, and the detection of step ST3 is implemented. Also, confirmation of the alternating current power supply situation is continued after the operation of the power conversion device is stopped in step ST6.

Herein, the reference voltage value set in step ST2 is such that the reference voltage value is equal to or smaller than the absolute value of the alternating current power supply voltage in a phase of a time that is one-half of the allowable capacitor discharge time T21 from a point of a zero crossing of the alternating current power supply voltage, as illustrated in FIG. 4. Also, the reference current value is equal to or smaller than the absolute value of the alternating current power supply current in a phase of a time that is one-half of the allowable capacitor discharge time T21 from a point of a zero crossing of the alternating current power supply current, as similarly illustrated in FIG. 4. Also, a value determined by a computation using the effective value of the AC/DC converter input voltage can be used as the reference voltage value, and when the value determined by a computation using the effective value of the AC/DC converter input voltage is equal to or greater than a predetermined voltage value, the reference voltage value can be set to the predetermined voltage value. Also, with regard to the reference current value too, a value determined by a computation using the effective value of the AC/DC converter input current can be used, and when the value determined by a computation using the effective value of the AC/DC converter input current is equal to or greater than a predetermined current value, the reference current value can be set to the predetermined current value.

Also, when the power of the alternating current power supply is restored after the control unit causes the operations of the AC/DC converter and the DC/DC converter to stop in step ST6, the control unit causes the AC/DC converter and the DC/DC converter to operate again. Because of this, the power conversion device carries out a steady operation again. Also, the control unit holds a control constant for controlling the AC/DC converter and the DC/DC converter when causing the power conversion device to operate, and when the power of the alternating current power supply is restored after the control unit causes the operations of the AC/DC converter and the DC/DC converter to stop, the control unit can cause the AC/DC converter and the DC/DC converter to operate again after initializing the control constant. In this case, the control unit causes the AC/DC converter and the DC/DC converter to operate again in a predetermined start-up sequence used when operations are started.

Figure 6:
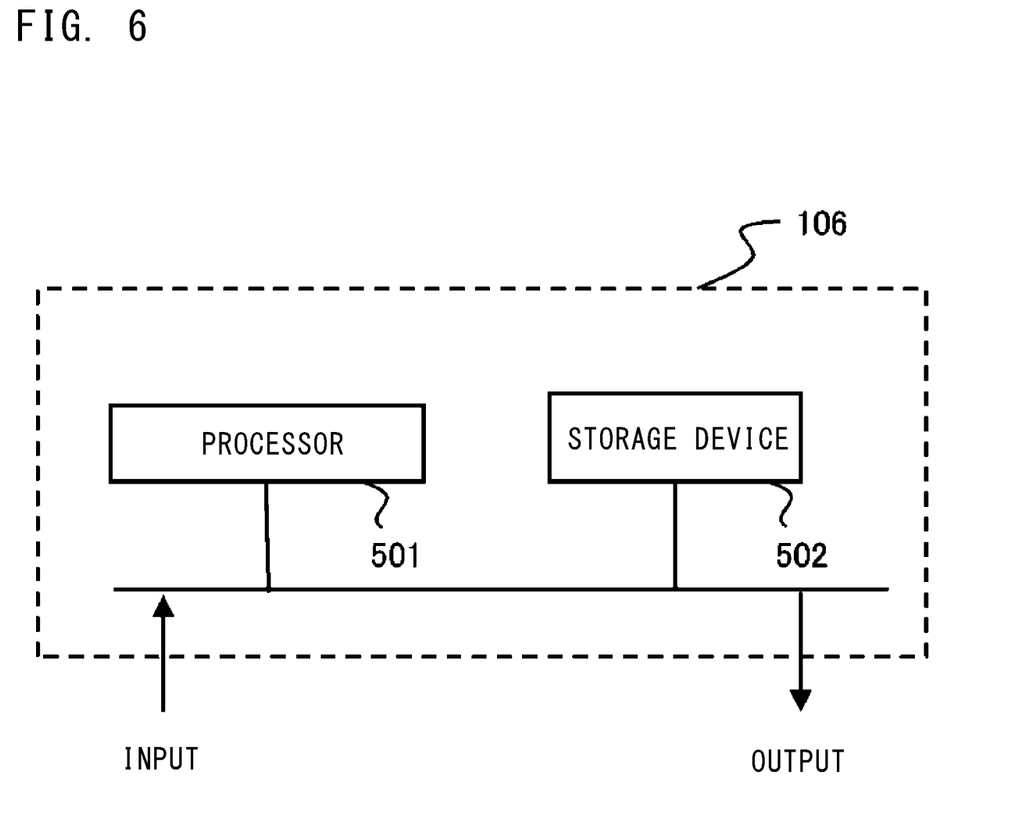
FIG. 6 is a configuration drawing showing a control unit hardware configuration.

The control unit 106 is configured of a processor 501 and a storage device 502, as shown in a hardware configuration example in FIG. 6. Although details of the storage device 502 are not shown, the storage device 502 includes a volatile storage device, such as a random-access memory, and a non-volatile auxiliary storage device, such as a flash memory. The processor 501 executes a program input from the storage device 502. Also, a hard disk auxiliary storage device may be included instead of a flash memory. In this case, the program is input from the auxiliary storage device into the processor 501 via the volatile storage device. Also, the processor 501 may output data such as a computation result to the volatile storage device of the storage device 502, or may save the data in the auxiliary storage device via the volatile storage device.

Although the present application is described in terms of an exemplifying embodiment, it should be understood that the various features, aspects, and functions described in the embodiment are not limited in their applicability to a particular embodiment, but instead can be applied, alone or in various combinations, to other embodiments.

It is therefore understood that numerous modifications that have not been exemplified can be devised without departing from the scope of the present application. For example, at least one constituent component may be modified, added, or eliminated.

REFERENCE SIGNS LIST

100 power conversion device, 101 alternating current power supply, 102 AC/DC converter, 103 capacitor, 104 DC/DC converter, 105 load, 106 control unit, 106*a* AC/DC converter control unit, 106*b* DC/DC converter control unit, 107 current detecting unit, 108 voltage detecting unit, 109 capacitor voltage detecting unit, 110 current limiting resistor, 111 switching means, 501 processor, 502 storage device

The invention claimed is:

1. A power conversion device provided between an alternating current power supply and a load, the power conversion device comprising:
a power converter;
a current detector coupled between the power converter and a first terminal of a switch;
a voltage detector coupled to the first terminal of the switch;
the switch, wherein a second terminal of the switch is configured to couple to the alternating current power supply;
a current-limiting resistor connected to the first terminal of the switch and to the second terminal of the switch;
a capacitor connected to an output end of the power converter;
a power detector that detects power input into the power converter, wherein the power detector includes the current detector and the voltage detector; and
a controller that detects a change in the input power based on a value detected by the power detector, predicts a decrease of power of the capacitor caused by the change in the input power, and causes an operation of the power converter to stop by opening the switch.

2. The power conversion device according to claim 1, wherein the power converter is an AC/DC converter, configured of a semiconductor element, that converts power supplied from the alternating current power supply into direct current, and a DC/DC converter, configured of a semiconductor element, that converts power output by the AC/DC converter into a direct current voltage, and the capacitor is connected to an output end of the AC/DC converter.

3. The power conversion device according to claim 2, wherein the voltage detector detects an input voltage of the AC/DC converter and the current detector detects an input current of the AC/DC converter, and the controller has a reference voltage value and a reference current value, and causes operations of the AC/DC converter and the DC/DC converter to stop when absolute values of values detected by both the voltage detector and the current detector drop to or below the reference voltage value or to or below the reference current value for a predetermined time while the AC/DC converter and the DC/DC converter are operating.

4. The power conversion device according to claim 2, wherein, when the power of the alternating current power supply is restored after the controller causes the operations of the AC/DC converter and the DC/DC converter to stop, the controller causes the AC/DC converter and the DC/DC converter to operate again.

5. The power conversion device according to claim 4, wherein the controller holds a control constant for controlling the AC/DC converter and the DC/DC converter when causing the power conversion device to operate, and when the power of the alternating current power supply is restored after the controller causes the operations of the AC/DC converter and the DC/DC converter to stop, the controller causes the AC/DC converter and the DC/DC converter to operate again after initializing the control constant.

6. The power conversion device according to claim 4, wherein, when the power of the alternating current power supply is restored after the controller causes the operations of the AC/DC converter and the DC/DC converter to stop, the controller causes the AC/DC converter and the DC/DC converter to operate again in a predetermined start-up sequence used when operations are started.

7. The power conversion device according to claim 2, wherein a wide bandgap semiconductor material is used as a material of the semiconductor elements.

8. A power conversion device provided between an alternating current power supply and a load, the power conversion device comprising:
a power converter;
a capacitor connected to an output end of the power converter;
a power detector that detects power input into the power converter; and
a controller that detects a change in the input power based on a value detected by the power detector, predicts a decrease of power of the capacitor caused by the change in the input power, and causes an operation of the power converter to stop,
wherein the power converter is an AC/DC converter, configured of a semiconductor element, that converts power supplied from the alternating current power supply into direct current, and a DC/DC converter, configured of a semiconductor element, that converts power output by the AC/DC converter into a direct current voltage, and the capacitor is connected to an output end of the AC/DC converter,
wherein the power detector is a voltage detector that detects an input voltage of the AC/DC converter and a current detector that detects an input current of the AC/DC converter, and the controller has a reference voltage value and a reference current value, and causes operations of the AC/DC converter and the DC/DC converter to stop when an absolute value of a value detected by either one of the voltage detector and the current detector drops to or below the reference voltage value or to or below the reference current value for a predetermined time while the AC/DC converter and the DC/DC converter are operating.

9. The power conversion device according to claim 8, wherein the reference voltage value is equal to or smaller than an absolute value of a voltage of the alternating current power supply in a phase of a time that is one-half of the predetermined time from a point of a zero crossing of the voltage of the alternating current power supply.

10. The power conversion device according to claim 8, wherein the reference current value is equal to or smaller than an absolute value of a current of the alternating current power supply in a phase of a time that is one-half of the predetermined time from a point of a zero crossing of the current of the alternating current power supply.

11. The power conversion device according to claim 8, wherein the reference voltage value is a value determined by a computation using an effective value of the input voltage of the AC/DC converter.

12. The power conversion device according to claim 11, wherein, when the reference voltage value determined by a computation using the effective value of the input voltage of the AC/DC converter is equal to or greater than a predetermined voltage value, the reference voltage value is set to the predetermined voltage value.

13. The power conversion device according to claim 8, wherein the reference current value is a value determined by a computation using an effective value of the input current of the AC/DC converter.

14. The power conversion device according to claim 13, wherein, when the reference current value determined by a computation using the effective value of the input current of the AC/DC converter is equal to or greater than a predetermined current value, the reference current value is set to the predetermined current value.

15. The power conversion device according to claim 8, wherein the controller holds an input current target value for controlling the AC/DC converter, and the reference current value is a value that is a predetermined value subtracted from the target value.

16. The power conversion device according to claim 8, wherein the predetermined time is a time shorter than that from a time at which the voltage of the alternating current power supply decreases until a voltage of the capacitor drops to or below a maximum value of the alternating current power supply.

17. The power conversion device according to claim 16, wherein an output power P, a capacitance C of the capacitor, a voltage V0 of the alternating current power supply at the time at which the voltage of the alternating current power supply decreases, and a maximum value V1 of the voltage of the alternating current power supply when power is restored, are used in a computation that sets the predetermined time, the output power P is a maximum output power of the power conversion device, the capacitance C of the capacitor is a minimum capacitance that takes initial capacitance deviation, temperature variation, and temporal deterioration into consideration, the voltage V0 is a minimum voltage of the capacitor when the power conversion device is operating, and the maximum value V1 of the voltage of the alternating current power supply when power is restored is a maximum value of input voltage prescribed for the power conversion device as a product.

18. The power conversion device according to claim 16, wherein the predetermined time is 500 microseconds or less.

19. A power conversion device provided between an alternating current power supply and a load, wherein the alternating current power supply is configured to provide a power supply voltage waveform, the power conversion device comprising:

a power converter;

a capacitor connected to an output end of the power converter;

a power detector configured to:

detect a power input into the power converter, and provide, to a controller, a measured supply voltage value over a fraction of a reference discharge time of the capacitor; and the controller, wherein the controller is configured to:

compare the measured supply voltage value with a reference voltage value, wherein the reference voltage value is obtained based on a steady power supply voltage waveform referred to a zero crossing, wherein the reference voltage value and the fraction of the reference discharge time are configured to be sufficiently low and short, respectively, to detect a short power failure or momentary interruption when the measured supply voltage is less than the reference voltage value for longer than the fraction of the reference discharge time, and wherein the reference voltage value and the fraction of the reference discharge time are configured to be sufficiently high and long, respectively, to avoid a shut down near the zero crossing of the steady power supply voltage waveform when the steady power supply voltage waveform will not be less than the reference voltage value for the fraction of the reference discharge time or longer, detect a change in the input power based on the comparison of the measured supply voltage with the reference voltage value, and cause an operation of the power converter to stop when the short power failure or the momentary interruption occurs.

* * * * *